United States Patent
Bal et al.

(10) Patent No.: US 7,030,648 B2
(45) Date of Patent: Apr. 18, 2006

(54) HIGH PERFORMANCE INTERCONNECT ARCHITECTURE FOR FIELD PROGRAMMABLE GATE ARRAYS

(75) Inventors: Ankur Bal, Ghaziabad (IN); Namerita Khanna, Delhi (IN)

(73) Assignee: STMicroelectronics PVT, Ltd., Uttar Pradesh (IN)

(*) Notice: Subject to any disclaimer, the term of this patent is extended or adjusted under 35 U.S.C. 154(b) by 111 days.

(21) Appl. No.: 10/739,395

(22) Filed: Dec. 18, 2003

(65) Prior Publication Data
US 2004/0178821 A1    Sep. 16, 2004

(30) Foreign Application Priority Data
Dec. 19, 2002   (IN)   .................. 1281/DEL/2002

(51) Int. Cl.
*H03K 19/173* (2006.01)

(52) U.S. Cl. .................................. 326/38; 326/41
(58) Field of Classification Search ........... 326/37–41, 326/101
See application file for complete search history.

(56) References Cited

U.S. PATENT DOCUMENTS 5,825,203 A * 10/1998 Kusunoki et al. .............. 326/41

* cited by examiner

Primary Examiner—Don Le

(57) ABSTRACT

This invention relates to a high performance interconnect architecture providing reduced delay minimized electromigration and reduced area in FPGAs comprising a plurality of tiles consisting of interconnected logic blocks, that are separated by intervening logic blocks. Each set of interconnected logic blocks is linked by an interconnect segment that is routed in a straight line through an interconnect layer over intervening logic blocks and is selectively connected to the logic block at each end through a connecting segment.

20 Claims, 3 Drawing Sheets

HIGH PERFORMANCE INTERCONNECT ARCHITECTURE FOR FIELD PROGRAMMABLE GATE ARRAYS

FIELD OF THE INVENTION

This invention relates generally to Field Programmable Gate Arrays ("FPGAs") and, more particularly, to a high performance interconnect architecture for FPGAs.

BACKGROUND OF THE INVENTION

Field Programmable Gate Arrays ("FPGAs") are popular devices for implementing electronic circuits. A basic FPGA contains Configurable Logic Blocks ("CLBs"), routing matrices and input/output ("I/O") blocks. The combination of these provides flexibility and enables the configuration of almost any digital electronic circuit. The desired circuit can be implemented by configuring the CLBs using a software tool.

The interconnect architecture plays an important role in facilitating the configuration of the FPGAs. The interconnect architecture is required to provide maximum utilization of the logic resources available on chip, minimize latency, be simple to configure and occupy the smallest possible area on the chip.

Tiled interconnect architectures are popular because of their simplicity and reusability.

FIG. 1 shows the schematic diagram of a basic "quad line" tile 100 used to construct the interconnect architecture. The basic cell consist of configurable logic blocks 101, a band of routing segments 102 and vias 103, 104. The band of routing segments 102 comprises a plurality of interconnect segments, each of which connects two CLBs through via 103. The band of routing segments propagates through bent section 105 and through cross over layer 106 for connecting the first and the last interconnect segments through via 104.

FIG. 2 shows an interconnect architecture constructed by replicating the basic cell of FIG. 1. The interconnect segment starts and ends at an interface 201. As shown, for a "quad line" architecture, an interconnect segment traverses four tiles before terminating at another interface matrix 201. The line segment has bent sections 202 in the first three tiles and another fragment 203 in the fourth tile where the segment terminates. While fabricating a segment, the bent sections 202 are placed on a metal layer different from the metal layers for fragments 203. Vias link the fragments 203 and interconnect segments 204.

A similar type of interconnect architecture is described in U.S. Pat. No. 6,204,690. This patent uses a combination of single-length interconnect lines connecting to adjacent tiles, and intermediate-length interconnect lines connecting to tiles separated further apart. This arrangement results in an interconnect hierarchy that allows any logic block to be connected to any other logic block. This also allows for fast paths to both adjacent tiles and tiles some distance away. Longer interconnect lines may be included as a third level of hierarchy to permit interconnection of widely separated tiles.

U.S. Pat. No. 5,760,604, provides an interconnect architecture that uses logic-unit output lines, of more than one length and provides extension lines to increase the reach of a logic unit output line.

All the patents mentioned above describe symmetric tile architectures for a programmable device requiring a physical staggering of routing lines. A line/group of lines are staggered in a tile to maintain tile symmetry. These tiles when replicated and placed next to each other, generate a routing channel with multiple length lines in the channel.

The interconnect architecture as described in above referred patents and any channel generation by tile replication in the manner described suffers following drawbacks.

A signal propagating between two ports has to pass through a series of vias and interconnect layers resulting in increased signal delays.

Interconnect layers are extensively bent along the signal path leading to electro-migration issues.

Introduction of extra interconnect layers in the physical layout restricts other connectivity.

SUMMARY OF THE INVENTION

To address the above-discussed deficiencies of the prior art, a primary object of this invention is to overcome above drawbacks and provide a programmable gate array with good interconnect flexibility.

Another object of the invention to provide an interconnect structure that occupies minimum area.

Yet another object of the invention is to minimize signal latency by providing straight line interconnect segments.

It is also an object of the invention to minimize electro migration in interconnect lines.

To achieve these and other objectives, the invention provides a high performance interconnect architecture providing reduced delay, minimized electro-migration and reduced area in FPGAs comprising a plurality of tiles consisting of interconnected logic blocks, that are separated by intervening logic blocks. Each set of interconnected logic blocks is linked by an interconnect segment that is routed in a straight line throughout and an interconnect layer over intervening logic blocks and is selectively connected to the logic block at each end through a connecting segment.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the terms "circuit" and "circuitry" may be used interchangeably and mean any device or part thereof that controls at least one operation, such a device may be implemented in hardware, firmware or software, or some combination of at least two of the same. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be described with the reference to the accompanying drawings, in which like reference numerals represent like parts, and in which.

DETAILED DESCRIPTION OF THE INVENTION

Figure 3:
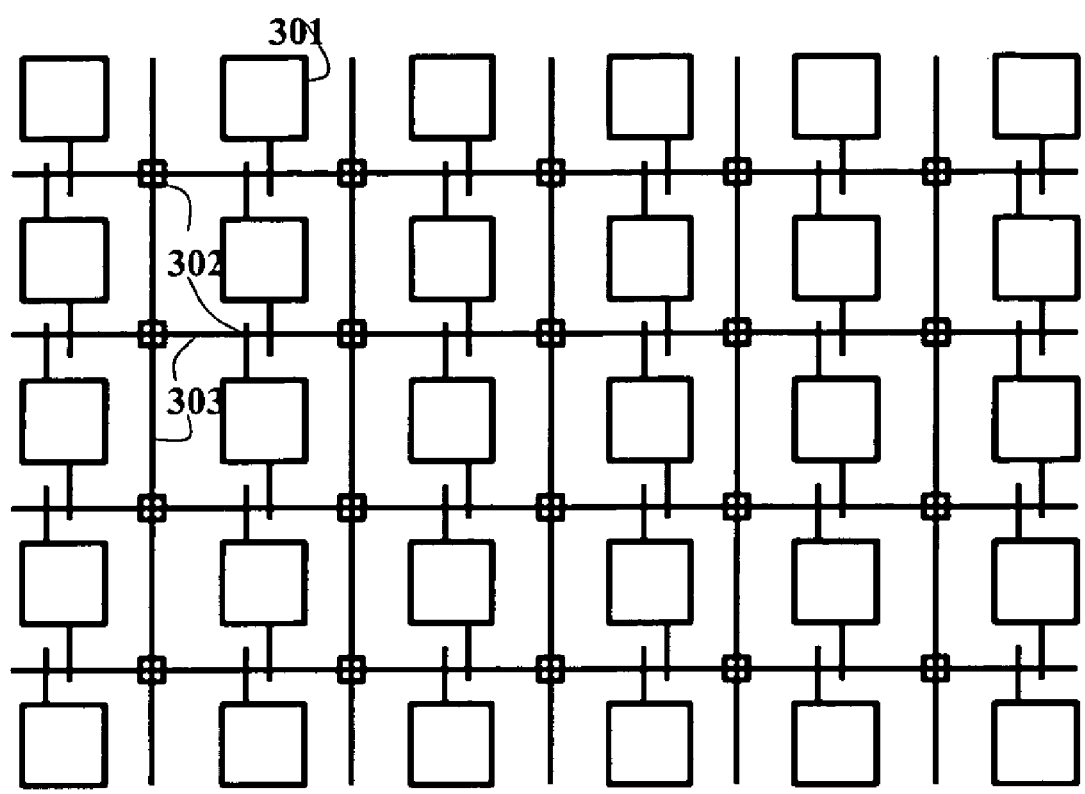
FIG. 3 shows the schematic diagram of a conventional field programmable gate array (FPGA).
Figure 4:
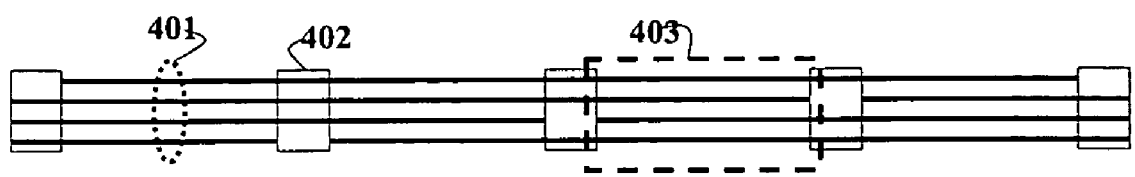
FIG. 4 shows the schematic diagram of an improved routing architecture in accordance with the present invention.
Figure 5:
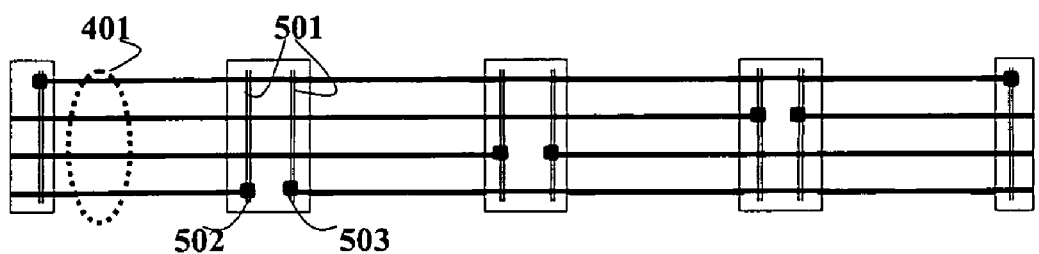
FIG. 5 shows a detailed structure of a tile in the improved interconnect architecture.

FIGS. 3–5, discussed below, and the various embodiments used to describe the principles of the present invention in this patent document are by way of illustration only and should not be construed in any to limit the scope of the invention. Those skilled in the art will understand that the principles of the present invention may be implemented in any suitably arranged FPGA.

Figure 1:
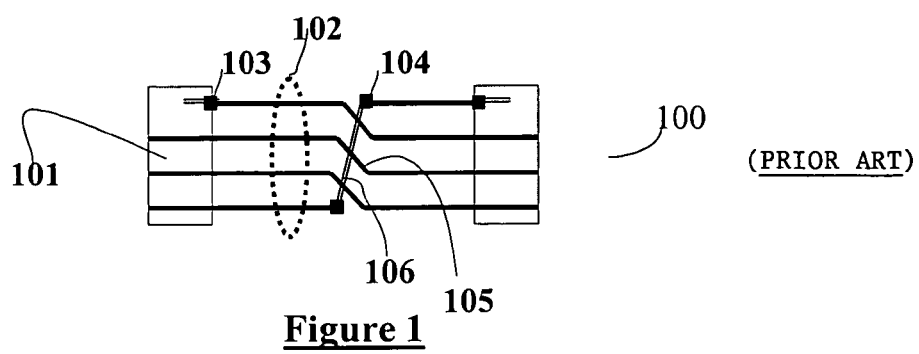
FIG. 1 shows the schematic diagram of the basic cell of a conventional quad line routing architecture.
Figure 2:
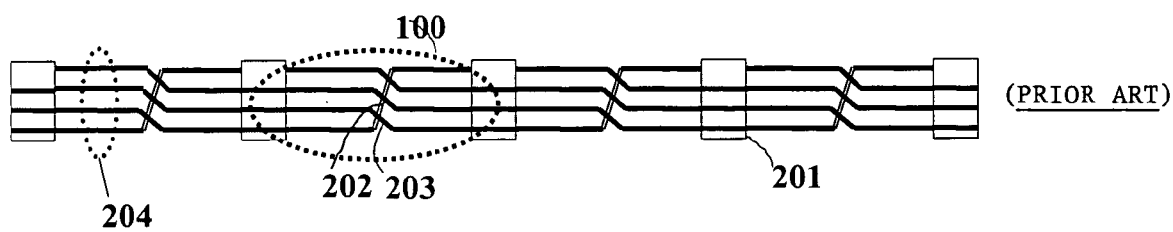
FIG. 2 shows the schematic diagram of a conventional quad line routing architecture.

FIG. 3 shows the schematic diagram of an FPGA consisting of an array of spatially distributed programmable logic elements. The programmable logic elements [301] can be connected by programmable routing elements 303 extending between them. During device operation, these programmable elements operate concurrently in order to perform some intended functionality. The flexibility provided by the programmable routing elements and connectors [303 and 302] is an important factor that determines the routability between the programmable logic elements [301]. The routing channel [303] running orthogonally across the array consists of a number of routing segments arranged in a manner so as to offer maximum interconnect flexibility. An offset is introduced between the segments in order to achieve good interconnect distribution in the channel. FIGS. 1 and 2 delineate such a scheme.

FIG. 4 illustrates an overview of a preferred embodiment of channel construction according to the instant invention. The arrangement involves segments spanning four blocks, where a block is the region encompassed by [403]. The routing tracks [401] have start and finish ports at interface matrices [402]. It is clear from the illustration that the routing tracks [401] are neither bending at any point in the channel and nor are they changing any interconnect layers during their course of propagation.

In this type of interconnect architecture, the interconnect delays are substantially reduced as each routing segment now traverses the shortest distance between the interface matrix ports. The line impedance also goes down because of no intermediate layer change while the absence of bends or sharp edges in the track layer eliminates the problems associated with electro-migration. Finally, area blockage due to layer change is mitigated as segment sections consist of a single interconnect layer.

FIG. 5 shows a detailed construction view of the routing channel shown in FIG. 4. The interface matrix port layer [501] is seen extending across the channel segments. Vias [502] and [503] connect routing segments [401] to the interface matrix ports [501]. In order to emulate segment staggering, vias [502] and [503] are shifted at adjacent interface matrix blocks. The via shifting pattern is cyclic in nature and is seen repeated every four blocks in the present embodiment. As will be appreciated by those skilled in the art, the interface port layer patch [501] simplifies physical layout design and the problem of staggering is eventually reduced to a via placement exercise.

Thus, the routing segment construction methodology in the present invention offers superior overall performance over its previous counterparts without any compromise in flexibility. It is intended that the present invention encompass such changes and modifications as fall within the scope of the appended claims.

What is claimed is:

1. A high performance interconnect architecture for a field programmable gate array (FPGA), comprising a plurality of tiles, each tile comprising:
   a plurality of logic blocks, each of which can be selectively connected to one or more logic blocks separated from it by one or more intervening logic blocks,
   a plurality of interconnect segments, each of which connects two or more logic blocks and is routed in a straight line through an interconnect layer over the one or more intervening logic blocks, and
   a connecting segment provided at a periphery within each logic block for selectively connecting the logic block with one of the interconnect segments.

2. The interconnect architecture as claimed in claim 1, wherein the connecting segments are fabricated on a metallization layer different from a metallization layer used for the interconnect segments to facilitate crossing over intermittent interconnect segments.

3. The interconnect architecture as claimed in claim 1, wherein the connecting segments are connected to the interconnect segments through vias.

4. The interconnect architecture as claimed in claim 1, wherein two connecting segments connected to two interconnect segments are provided for each logic block.

5. The interconnect architecture as claimed in claim 1, wherein:
   the two connecting segments are located at specified locations of each logic block; and
   the specified locations are shifted in adjacent ones of the logic blocks to emulate a staggering line topology using straight line interconnect segments.

6. The interconnect architecture as claimed in claim 4, wherein each interconnect segment connects two logic blocks that are separated by at least two intervening logic blocks.

7. A method for providing a high performance interconnect architecture for a field programmable gate array (FPGA), comprising the steps of:
   providing a plurality of tiles,
   providing a plurality of logic blocks within each tile,
   enabling selective connection between a plurality of the logic blocks separated from each other by one or more intervening logic blocks,
   routing a plurality of interconnect segments, each interconnect segment routed between two connected logic blocks in a straight line through an interconnect layer over the one or more intervening logic blocks, and
   providing a connecting segment at a periphery of each logic block for selective connection of the logic block with one of the interconnect segments.

8. The method as claimed in claim 7, including fabricating said connecting segments on metallization layers that are different from metallization layers used for fabricating the interconnect segments to facilitate crossing over intermittent interconnecting segments.

9. The method as claimed in claim 7, including linking of the connecting segments to the interconnect segments through vias.

10. The method as claimed in claim 7, wherein two connecting segments connected to two interconnect segments are provided for each logic block.

11. The method as claimed in claim 10, wherein:
the two connecting segments are located at specified locations of each logic block; and
the specified locations are shifted in adjacent ones of the logic blocks to emulate a staggering line topology using straight line interconnect segments.

12. The method as claimed in claim 10, wherein each interconnect segment connects two logic blocks that are separated by at least two intervening logic blocks.

13. A field programmable gate array comprising a plurality of tiles, at least one of the tiles comprising:
a plurality of logic blocks, each logic block capable of being connected to one or more non-adjacent logic blocks;
a plurality of interconnect segments, each interconnect segment routed in a straight line over one or more intervening logic blocks between two connected logic blocks; and
at least one connecting segment, each connecting segment capable of connecting one of the logic blocks to one of the interconnect segments.

14. The field programmable gate array as claimed in claim 13, further comprising a plurality of vias, each via connecting one connecting segment with one of the interconnect segments.

15. The field programmable gate array as claimed in claim 13, wherein each logic block includes two connecting segments connected to two of the interconnect segments.

16. The field programmable gate array as claimed in claim 15, wherein:
the two connecting segments are located at specified locations of each logic block; and
the specified locations are shifted in adjacent ones of the logic blocks to emulate a staggering line topology using straight line interconnect segments.

17. The field programmable gate array as claimed in claim 13, wherein each connecting segment is disposed along a periphery of the logic block.

18. The field programmable gate array as claimed in claim 13, wherein each interconnect segment connects two logic blocks that are separated by at least two intervening logic blocks.

19. The field programmable gate array as claimed in claim 13, wherein each interconnect segment connects two logic blocks that are separated by three intervening logic blocks.

20. The field programmable gate array as claimed in claim 13, wherein the plurality of tiles are arranged orthogonally in the field programmable gate array.

* * * * *